United States Patent
Rauf et al.

(10) Patent No.: US 6,969,568 B2
(45) Date of Patent: Nov. 29, 2005

(54) METHOD FOR ETCHING A QUARTZ LAYER IN A PHOTORESISTLESS SEMICONDUCTOR MASK

(75) Inventors: Shahid Rauf, Pflugerville, TX (US); Peter L. G. Ventzek, Austin, TX (US); Wei E. Wu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 46 days.

(21) Appl. No.: 10/766,205

(22) Filed: Jan. 28, 2004

(65) Prior Publication Data

US 2005/0164514 A1 Jul. 28, 2005

(51) Int. Cl.$^7$ .............................................. H01L 21/302
(52) U.S. Cl. ....................... 430/5; 438/723; 438/736; 438/742; 438/743; 216/24; 216/51; 216/80
(58) Field of Search ................. 438/723, 736, 438/742, 743; 216/24, 51, 80; 430/5; 156/345.43

(56) References Cited

U.S. PATENT DOCUMENTS

| | | | |
|---|---|---|---|
| 4,957,834 A | 9/1990 | Matsuda et al. | |
| 5,691,090 A | 11/1997 | Isao et al. | |
| 6,503,664 B2 * | 1/2003 | Dove et al. | 430/5 |
| 6,524,755 B2 | 2/2003 | Jin et al. | |
| 6,703,169 B2 * | 3/2004 | Fuller et al. | 430/5 |

FOREIGN PATENT DOCUMENTS

EP 0 668 539 A2 8/1995

OTHER PUBLICATIONS

Constantine et al., "ICP Quartz Etch Uniformity Improvement for Phase Shift Mask Fabrication," *Part of the SPIE Conference on Photomask and X-Ray Mask Technology V*, Kawasaki, Japan, SPIE, vol. 3412, Apr. 1998, pp. 220-.
Dahm et al., "Quartz Etching for Phase Shifting Masks," *Microelectronic Engineering*, 1995, vol. 27, pp. 263-266.
Wu et al., "$CF_4/O_2$ Plasma Simulation and Comparison with Quartz Etch Experiment," *Photomask and Next-Generation Lithography Mask Technology VIII*, Hiroichi Kawahira, Editor, *Proceedings of SPIE*, 2001, vol. 4409, pp. 409-417.
Zeze et al., "Reactive Ion Etching of Quartz and Pyrex for Microelectronic Applications," *Journal of Applied Physics*, Oct. 2002, vol. 92, No. 7, pp. 3624-3629.

* cited by examiner

Primary Examiner—George A. Goudreau
(74) Attorney, Agent, or Firm—Robert L. King; Michael J. Balconi-Lamica

(57) ABSTRACT

A chromeless phase lithography mask (30) that does not require photoresist to manufacture has a quartz substrate (32) is etched by using a plasma (38) containing one of a nitrogen augmented hydro-fluorocarbon oxygen mixture and a nitrogen augmented fluorocarbon oxygen mixture. Various hydro-fluorocarbons or fluorocarbons may be used. The nitrogen addition results in etched openings in the quartz substrate that have substantially vertical sidewalls in a uniform manner across the substrate. Surface roughness is minimized and edges of the openings are well-defined with minimal rounding. The etch rate is rendered controllable by reducing bias power without degrading a desired vertical sidewall profile.

20 Claims, 3 Drawing Sheets

METHOD FOR ETCHING A QUARTZ LAYER IN A PHOTORESISTLESS SEMICONDUCTOR MASK

FIELD OF THE INVENTION

This invention relates generally to integrated circuits, and more specifically, to the manufacture of masks used to manufacture semiconductors.

BACKGROUND OF THE INVENTION

Phase shift mask (PSM) lithography is a known lithography technique for forming features on an integrated circuit. Photolithography requires sufficient resolution, contrast and depth of focus to form feature details having a minimum feature resolution. PSM requires etching of an underlying quartz mask plate and/or specifically deposited dielectric films to a depth that results in phase shifting of the light by a predetermined amount, typically one hundred eighty degrees.

To achieve lower cost, a technique known as chromeless phase lithography (CPL) has been proposed in the literature. CPL requires fewer electron beam lithography steps, thus reducing processing costs. Quartz etching for PSM manufacturing has typically been done using fluorocarbon oxygen plasma sources. The current processes that have been developed for PSM when applied to CPL have several shortcomings. These shortcomings include a fast quartz layer etch rate that makes it difficult to precisely control etching depth in the quartz layer. An incorrect depth in the quartz layer will result in incorrect shifting and ultimately reduce the feature contrast during subsequent semiconductor wafer fabrication. A second shortcoming with PSM based quartz etching applied to CPL includes non-uniformity of etching. In other words, across the mask etch depths and profiles vary. This variation also negatively affects feature contrast. A third shortcoming with PSM based quartz etching applied to CPL includes the fact that trench sidewalls become more non-vertical and slope angles vary more. A fourth shortcoming with PSM based quartz etching applied to CPL includes the fact that a chrome/chrome oxynitride stack is exposed and will be sputtered and therefore roughened. The sputtering also creates a second undesired effect. Due to sputtering, feature edges of a CPL mask become significantly rounded. Significant rounding results in a loss of lithography contrast.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
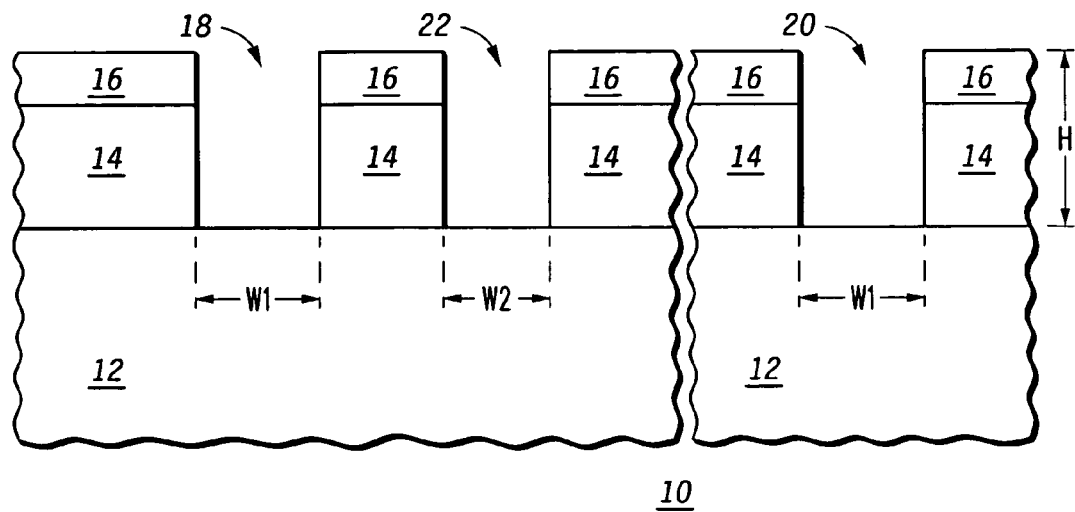
FIG. 1 illustrates in cross sectional form a known patterned mask prior to quartz etching.

Illustrated in FIG. 1 is a cross-section of a known mask 10. A quartz substrate 12 has formed thereon a chrome (Cr) layer 14. Overlying the chrome layer 14 is a chrome oxynitride ($CrO_xN_y$) layer 16. Openings 18 and 20 having a width W1 have been etched into the mask 10 using a halogen based plasma (e.g. chlorine based). The openings 18 and 20 are in separate areas of the mask 10 as noted by the break in mask 10. Additionally shown is an opening 22 having a width W2 that is less than W1. Because chrome layer 14 and the $CrO_xN_y$ layer 16 are thin, the sidewalls of the opening are substantially vertical. Additionally, halogen based metal etching plasmas are not highly polymerizing and are mainly ion driven. Therefore, there is a thin passivation layer (not illustrated) on the sidewalls that do not inhibit ion etching. As used herein, the term "quartz" is fused quartz that is crystal quartz that is melted at a white heat and cooled to form an amorphous glass. It is not birefringement and the refractive index is much lower than that of crystal quartz. Fused quartz of optical quality can be prepared by known techniques. The openings 18, 22 and 20 form stacks of the chrome layer 14 and $CrO_xN_y$ layer 16 having a height of H.

Figure 2:
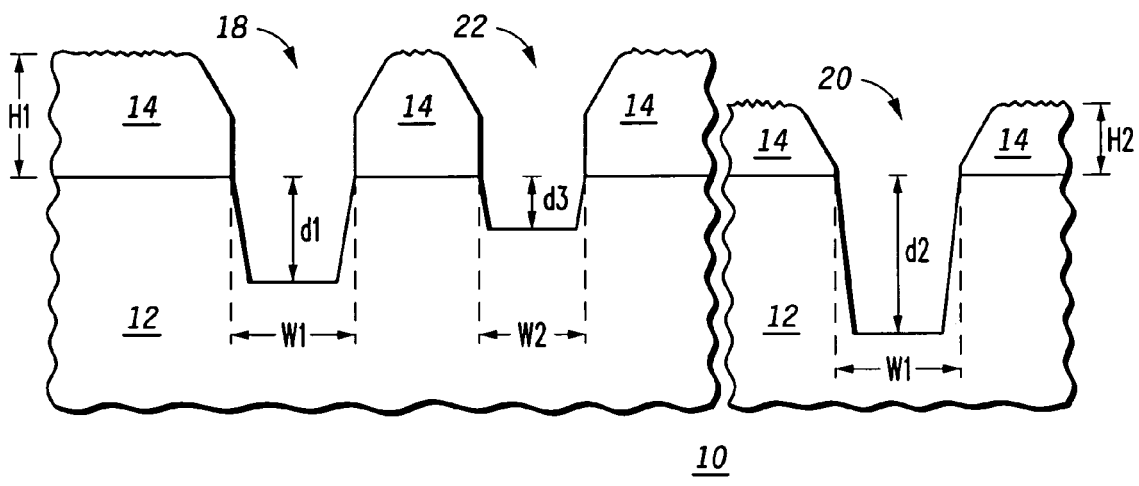
FIG. 2 illustrates in cross sectional form a known patterned mask after quartz etch processing.

Illustrated in FIG. 2 is the known mask 10 of FIG. 1 after additional processing. Quartz substrate 12 is etched by a conventional reactive ion etch (RIE) that also etches the $CrO_xN_y$ layer 16 and a portion of chrome layer 14. The RIE etch is an ion assisted etch and results from a synergistic interaction between ions and fluorocarbon radicals supplied from a plasma source. The plasma source typically contains a fluorine-containing element and a minimum ion energy source. There are several undesired effects of the RIE that will be now described. Note that the sidewalls of openings 18, 20 and 22 are sloped at various angles. This sloping is due to enhanced polymerization on the sidewalls as more fluorocarbon radicals reach the sidewalls in the absence of photoresist. The absence of photoresist decreases the aspect ratio, thereby allowing more polymerizing species to reach the sidewalls. Also, there is significant etch rate nonuniformity across mask 10 during the quartz etching process. For example, the depth of the openings 18 and 20, which have the same width W1 are not the same. Typically, for equal opening widths, the depth of the etch should also be equal. Note also that the smaller width (W2) opening 22 has a depth D3 that is smaller than depth D1. The nonuniformity of etch rate is due to the electronegative nature of fluorocarbon oxygen plasma which tends to pool ions over certain regions of the mask 10. Another disadvantage with the quartz etching of mask 10 is that the fluorine-containing plasma etch rate is so fast that it is difficult to accurately control the depth of an opening. Yet an additional disadvantage with the quartz etching of mask 10 is the faceting of the chrome layer 14 corners caused by ion driven physical sputtering. The faceting of the chrome layer 14 modifies the light transmission properties of mask 10 and will negatively affect lithography contrast. Increased faceting results from higher mass incident ions, such as $CF_3+$, present in the plasma accelerated to the mask 10 at an energy exceeding the sputter threshold of chrome. Yet another disadvantage is surface roughening of the chrome layer 14 due to sputtering. High energy bombardment of a metal, such as chrome, results in some surface roughening.

Figure 3:
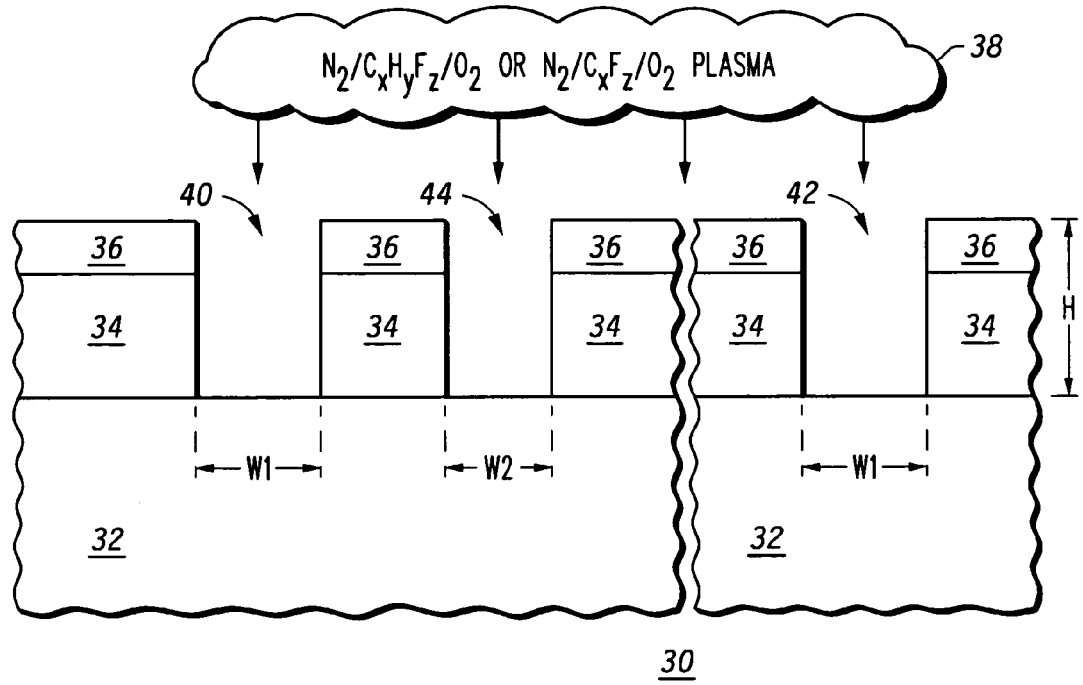
FIG. 3 illustrates in cross sectional form a patterned mask in the presence of a nitrogen-containing quartz etching plasma in accordance with the present invention.

Illustrated in FIG. 3 is part of a CPL mask 30 that is in a photoresistless state. In other words, the CPL mask 30 does not use photoresist to create the mask 30. As illustrated, CPL mask 30 has a quartz substrate 32, an overlying chrome layer 34 and an overlying $CrO_xN_y$ layer 36. Openings 40 and 42 have been formed with each opening having a width of W1. An opening 44 has a width W2 where W2 is less than W1. The openings 40, 42 and 44 form a predetermined pattern for being transferred into the underlying quartz substrate 32. To significantly improve the previously described disadvantages, a plasma 38 having nitrogen ($N_2$) added thereto is used to etch exposed portions of the quartz layer 32. In particular, plasma 38 is formed overlying the CPL mask 30. An etching plasma (commonly referred to as a low temperature non-equilibrium plasma) is an electrically conducting, charge-neutral gas or medium having ions, electrons and neutrals such that typically the ratio of electrons to neutrals is less than 0.001. The mean electron energies are on the order of a few electron volts. The ion energies in the bulk plasma are less than 0.1 eV and the gas temperatures are less than two thousand degrees Celsius. The plasma preferably contains either the combination of $C_xH_yF_z$, oxygen ($O_2$) and nitrogen ($N_2$) or the combination of $C_MF_N$, oxygen and nitrogen, where X, Y Z, M and N are integers. The percentage of each of these three component gases may vary within certain wide ranges. For example, the percentage of nitrogen that is used in the plasma may vary between substantially fifty percent to ninety percent, where the word "substantially" means approximately and may be either greater or less than the amount stated. The percentage of $C_xH_yF_z$ or $C_xF_z$ that is used in the plasma may vary between substantially five percent to forty-five percent. The percentage of oxygen that is used in the plasma may vary between substantially five to fifteen percent. It should be appreciated that these ranges are provided as examples and are not the only ratios that may be used. The component gas $C_xH_yF_z$ may be any of a variety of differing gases. For example, $C_2F_6$, $C_3F_6$, $C_4F_6$, $C_4F_8$ (c-$C_4F_8$), $C_5F_8$, $CF_4$ and hydrofluorocarbons such as $CHF_3$, $CH_3F_3$, $CH_2F_2$, or combinations thereof are examples of suitable component gases.

Adding nitrogen ($N_2$) to the etching gas mixture of $O_2$ and $C_2F_6$ and appropriately adjusting processing conditions considerably improves the quartz etching process for mask fabrication. One of the process conditions to be adjusted is the RF (radio frequency) bias power of the platen that CPL mask 30 is supported by in a plasma chamber. For example, a reduction of twenty-five percent may significantly improve the sidewall angle integrity and uniformity and decrease the etch rate. Other percentages of power reduction may be used for comparable favorable results. We have discovered that by using nitrogen in the plasma to etch the CPL mask 30, the plasma becomes less electro-negative and as a result more radial uniformity results. Further, the nitrogen is used to displace the hydro-fluorocarbon or hydrocarbon polymerization precursor. The decrease in polymer thickness on the sidewalls of the openings allows the sidewalls to be etched to a greater degree further resulting in a more vertical sidewall. For example, a use of approximately eighty percent nitrogen in the plasma 38 is known to have a beneficial effect of approximately four degrees more toward a vertical sidewall representing approximately a fifty percent improvement from a nitrogen-free plasma. By decreasing the power source the ion energies decrease resulting in a lower sputter etch yield and therefore a lower etch rate. Additionally, the mass of the major ion from nitrogen is less than the mass of the expected plasma components of the $C_2F_6$ plasma, such as $CF_3+$. Therefore, there is reduced roughness on the surface of the CPL mask 30 because there is reduced sputtering. The etch rate is controlled by the balanced transport of etchants through a polymer layer (a reaction-diffusion layer) at the bottom of the openings, the thickness of which is controlled typically by ion energy. Sidewall profile control of each opening is effected by the deposition of a passivant on the sidewall that protects the sidewall from etchant penetration. An example of the passivant is $CF_2$ and $CF_3$ radicals that are produced by breakdown of the primary fluorocarbon or hydro-flurocarbon gases in the plasma. Nitrogen is special in this case as other polymer displacement candidates are either more massive than nitrogen or have a higher ionization potential rendering the population of the ion low and not a participant in the phenomena occurring in the opening.

Figure 4:
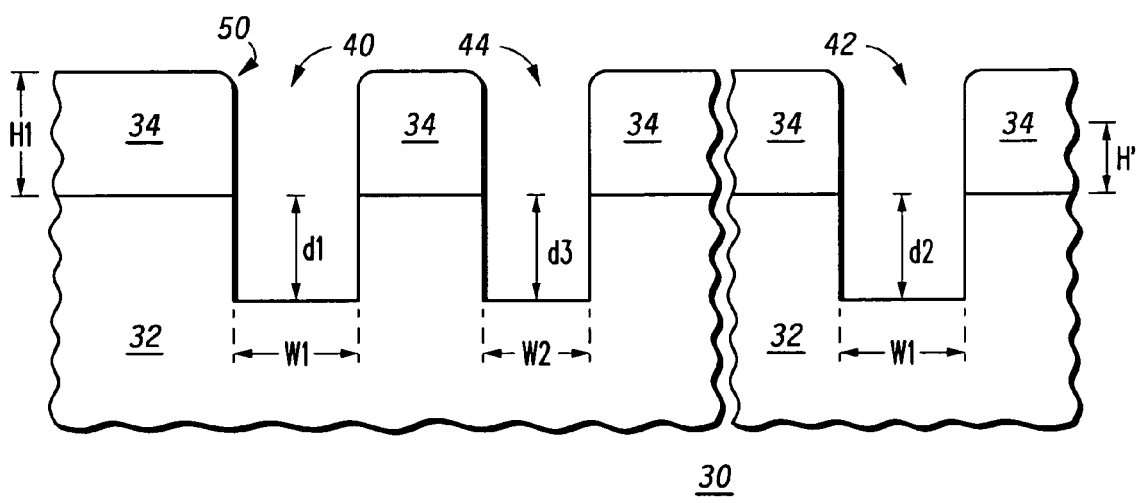
FIG. 4 illustrates in cross sectional form a patterned mask after quartz etch processing in accordance with the present invention.

Illustrated in FIG. 4 is a cross section of etched CPL mask 30 of FIG. 3. Elements common in each of FIG. 4 and FIG. 3 are similarly numbered. In FIG. 4, an etch of the $CrO_xN_y$ layer 36 has occurred in response to the action of plasma 38. Additionally, quartz layer 32 has been etched to depths of D1, D2 and D3 in openings 40, 42 and 44, respectively. The depths D1, D2 and D3 are chosen to have a depth that phase shifts light of a prescribed wavelength λ by 180 degrees relative to non-etched portions of the quartz substrate. The wavelength λ is a wavelength of a predetermined light source. Accordingly, the depths D1, D2 and D3 are substantially equal to the quantity lamda divided by the quantity of two times (n−1), or (λ/(2n−1), where n is a reflective index of the quartz substrate 32 at the wavelength λ.

Due to the uniformity improvements of plasma 38 as discussed above, the depths D1, D2 and D3 are substantially the same value. Note also the improved sidewall angles of the openings 40, 42 and 44 as a result of the interaction discussed above. The sidewalls are substantially vertical from a lower surface of each opening to an upper surface of the chrome layer 34. Note also that the upper edges of each opening are sufficiently defined and not degraded as was the result in FIG. 2. For example, edge 50 is only slightly rounded and provides a corner that more closely approximates ninety degrees. As a result, feature resolutions will be much sharper than for the degraded edges of FIG. 2. An additional improvement in the etched quartz layer 32 is the smoother upper surface of chrome layer 34 with less roughening. Although not specifically shown in FIG. 3, the CPL mask 30 may have certain areas where chrome layer 34 and $CrO_xN_y$ layer 36 are not originally present and therefore there are areas of CPL mask 30 that are chromeless. A commonly used term for such semiconductor masks is chromeless phase lithography masks.

Figure 5:
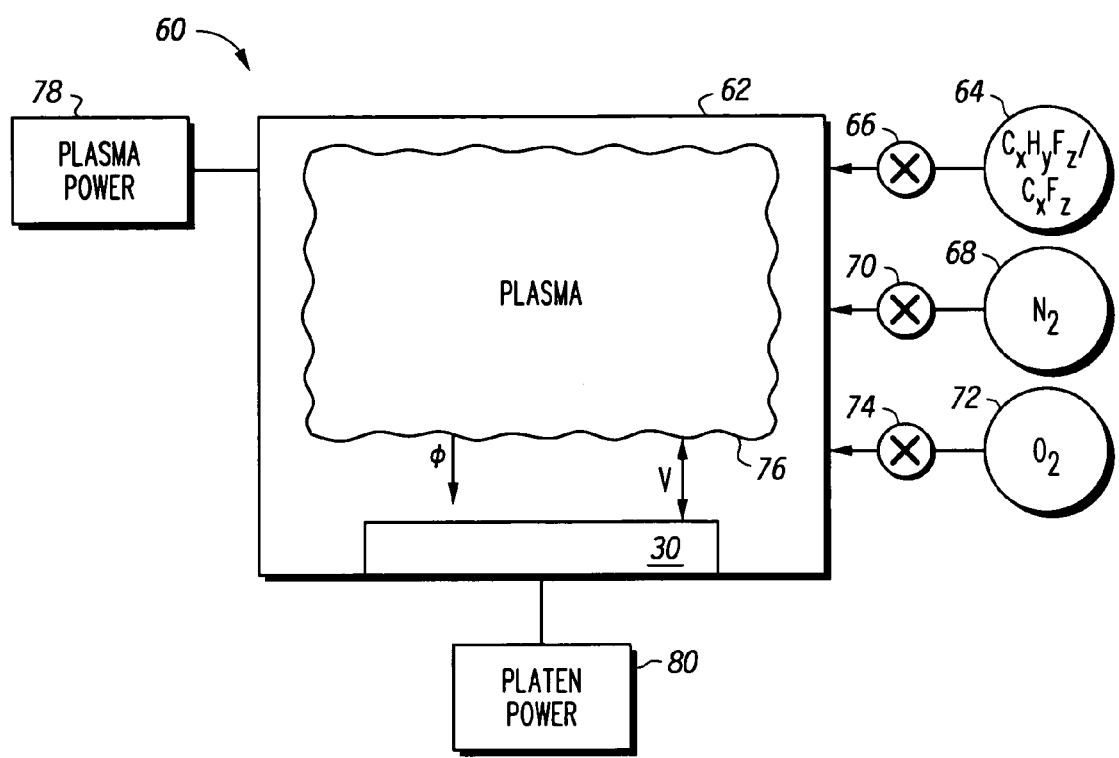
FIG. 5 illustrates in perspective form an etch processing system in accordance with the present invention.

Illustrated in FIG. 5 is a mask manufacturing system 60 for etching CPL mask 30 of FIGS. 3 and 4 as described above. A housing in the form of a plasma chamber 62 is provided for containing a plasma 76 generated having the composition described for plasma 38 of FIG. 3. The CPL mask 30 is placed on a platen (not shown) within the plasma chamber 62. A gas component source 64 stores the hydrofluorocarbon or fluorocarbon gas and is metered to plasma chamber 62 via a valve 66. A gas component source 68 stores the nitrogen gas and is metered to plasma chamber 62 via a valve 70. A gas component source 72 stores the oxygen gas and is metered to plasma chamber 62 via a valve 74. A plasma power supply 78 is connected to the plasma chamber 62 for providing the source power for plasma 76. A platen power supply 80 is connected to the plasma chamber 62 for providing bias power to the CPL mask 30. It should be understood that in some systems the two power supplies may be combined and a single power supply source is used. When powered, the plasma chamber 62 generates plasma 76 having a voltage V between the CPL mask 30 and the plasma 76 through a plasma sheath. The plasma 76 also sends a flux, Φ, of species generated in the plasma by gases $C_xH_yF_z$ or $C_xF_z$, $N_2$ and $O_2$.

By now it should be appreciated that there has been provided a method for etching a quartz mask with improved resulting features. The use of nitrogen with either a hydrofluorocarbon gas or a fluorocarbon gas and oxygen may be implemented without modifying conventional processing tools.

In the foregoing specification, the invention has been described with reference to specific embodiments. However, one of ordinary skill in the art appreciates that various modifications and changes can be made without departing from the scope of the present invention as set forth in the claims below. For example, various plasma chamber temperatures and pressures may be used to form the reactions described herein. Various etching depths may be implemented based upon the light wavelength and the widths of the openings may be scaled to any targeted process. Various types of power supplies may be used. The power supply sources may be implemented, in one form, by a power supply operating at predetermined frequencies, such as in the RF range, ultra-high frequency range, microwave range and others. Also, the power supplies may be inductively coupled or capacitively coupled to the housing containing the nitrogen-containing plasma. Accordingly, the specification and figures are to be regarded in an illustrative rather than a restrictive sense, and all such modifications are intended to be included within the scope of the present invention.

In one form there has been provided a method for etching quartz in the manufacture of a phase shift mask. A quartz mask is provided, the quartz mask including a quartz substrate, a Cr layer overlying the quartz substrate, and a $CrO_xN_y$ layer overlying the Cr layer. The Cr layer and $CrO_xN_y$ layer includes a pattern for being transferred into the underlying quartz substrate. The quartz mask is etched in one of a nitrogen ($N_2$), hydro-fluorocarbon ($C_xH_yF_z$), and oxygen ($O_2$) based plasma and a nitrogen, fluorocarbon ($C_xF_z$), and oxygen based plasma to transfer the pattern into the underlying quartz substrate. The values x, y and z are integers. In one form the $C_xF_z$ includes at least one of the following mixtures selected from the group $C_2F_6$, $C_3F_6$, $C_4F_6$, $C-C_4F_8$, $C_5F_8$, and the $C_xH_yF_z$ includes one of the following mixtures selected from the group consisting of $CHF_3$, $CH_3F$ and $CH_2F_2$. The quartz mask is a phase shift mask. The etching of the pattern into the underlying quartz substrate includes etching the quartz substrate to a depth that phase shifts light of a prescribed wavelength λ by 180 degrees relative to non-etched portions of the quartz substrate. The depth is substantially equal to the quantity lambda divided by the quantity of two times (n−1), that is, λ/(2(n−1)), where n is a reflective index of the quartz substrate at the wavelength λ. In one form the quartz mask is a resist-less quartz mask and a chromeless phase lithography mask. The plasma is a substantially uniform plasma in response to presence of the nitrogen. In one form, the percentage of $N_2$ is on the order of greater than or equal to 50%, the percentage of $C_xH_yF_z$ or $C_xF_z$ is on the order of less than between thirty-five to forty-five percent (35%–45%), and the percentage of $O_2$ is on the order of less than between five to fifteen percent (5%–15%). The plasma is rendered more uniform with an increase in nitrogen and a corresponding decrease in $C_xH_yF_z$ or $C_xF_z$. A corresponding plasma etch non-uniformity is less than 5%. The nitrogen contributes to the uniform plasma by reducing a concentration of negative ions over regions of the quartz mask. The etch rate for etching the quartz mask is controlled in response to a change in an effective bias power coupled to the plasma. Decreasing the effective bias power coupled to the plasma decreases an etch rate of the quartz substrate etching. The nitrogen portion of the plasma improves upon a sidewall profile of the patterned features by making the sidewall more vertical rather than angled or slanted. Therefore the nitrogen portion of the plasma improves upon a sidewall profile of the patterned features. The pattern that is transferred into the underlying quartz substrate includes transferring the pattern to a substantially uniform depth across the quartz substrate. The nitrogen portion of the plasma promotes more vertical patterned feature sidewalls by inhibiting excessive polymerization on the sidewalls of the patterned features. A resultant vertical profile of the patterned feature sidewalls is on the order of less than five degrees (5°) from vertical. Etching the Cr and $CrO_xN_y$ layers occurs at an etch rate that is sufficient to retain an integrity of the pattern being transferred to the underlying quartz mask. Less faceting or removal of material occurs at corners of the Cr layer than with a plasma other than one of a nitrogen ($N_2$), hydro-fluorocarbon ($C_xH_yF_z$), and oxygen ($O_2$) based plasma and a nitrogen ($N_2$), fluorocarbon ($C_xF_z$), and oxygen ($O_2$) based plasma. In another form there is herein provided a processing chamber for etching quartz in the manufacture of a phase shift mask having a housing and means for supporting a quartz mask in said housing. The quartz mask includes a quartz substrate, a Cr layer overlying the quartz substrate, and a $CrO_xN_y$ layer overlying the Cr layer. The Cr layer and $CrO_xN_y$ layer include a pattern for being transferred into the underlying quartz substrate. One of a nitrogen ($N_2$), hydro-fluorocarbon ($C_xH_yF_z$), and oxygen ($O_2$) based plasma and a nitrogen ($N_2$), fluorocarbon ($C_xF_z$), and oxygen ($O_2$) based plasma are generated in the housing, wherein responsive to generating the plasma, the plasma transfers the pattern into the underlying quartz substrate, where x, y and z are integers.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for etching quartz during manufacture of a semiconductor mask comprising:
   providing a quartz mask, the quartz mask comprising a quartz substrate, a Cr layer overlying the quartz substrate, and a $CrO_xN_y$ layer overlying the Cr layer, the Cr layer and $CrO_xN_y$ layer forming a pattern by having openings formed therein for being transferred into the quartz substrate; and
   etching the quartz mask in one of a nitrogen ($N_2$), hydro-fluorocarbon ($C_xH_yF_z$), and oxygen ($O_2$) based plasma and a nitrogen, fluorocarbon ($C_xF_z$), and oxygen based plasma to transfer the pattern into the quartz substrate, where x, y and z are integers.

2. The method of claim 1, wherein the fluorocarbon, $C_xF_z$, of the nitrogen, fluorocarbon and oxygen based plasma includes at least one selected from the group consisting of:

$C_2F_6$, $C_3F_6$, $C_4F_6$, c-$C_4F_8$, $C_5F_8$, and the hydro-fluorocarbon, $C_xH_yF_z$, of the nitrogen, hydro-fluorocarbon and oxygen based plasma includes one selected from the group consisting of $CHF_3$, $CH_3F$ and $CH_2F_2$.

3. The method of claim 1, wherein the quartz mask comprises a phase shift mask and wherein etching the pattern into the quartz substrate includes etching the quartz substrate to a depth that phase shifts light of a prescribed wavelength λ by 180 degrees relative to non-etched portions of the quartz substrate.

4. The method of claim 3, wherein the depth is substantially equal to the quantity lambda divided by the quantity of two times (n−1), that is, λ/(2(n−1)), where n is a reflective index of the quartz substrate at the wavelength λ.

5. The method of claim 1, wherein the quartz mask comprises a resist-less quartz mask.

6. The method of claim 1, wherein each of the nitrogen, hydro-fluorocarbon and oxygen based plasma and the nitrogen, fluorocarbon and oxygen based plasma comprises a substantially uniform plasma in response to presence of the nitrogen.

7. The method of claim 1, wherein a percentage of nitrogen is on an order of greater than or equal to 50%, a percentage of one of $C_xH_yF_z$ and $C_xF_z$ is on an order of less than between thirty-five to forty-five percent (35%–45%), and a percentage of oxygen is on an order of less than between five to fifteen percent (5%–15%).

8. The method of claim 7, wherein increased plasma uniformity is rendered with an increase in nitrogen and a corresponding decrease in one of $C_xH_yF_z$ and $C_xF_z$.

9. The method of claim 8, wherein a corresponding plasma etch non-uniformity is less than 5%.

10. The method of claim 8, wherein the nitrogen contributes to plasma uniformity by reducing a concentration of negative ions over regions of the quartz mask.

11. The method of claim 1, further comprising controlling an etch rate of etching the quartz mask in response to a change in an effective bias power coupled to the nitrogen, hydro-fluorocarbon and oxygen based plasma or the nitrogen, fluorocarbon and oxygen based plasma.

12. The method of claim 11, wherein decreasing the effective bias power coupled to the nitrogen, hydro-fluorocarbon and oxygen based plasma or the nitrogen, fluorocarbon and oxygen based plasma decreases an etch rate of the quartz substrate etching.

13. The method of claim 12, wherein the nitrogen portion of each of the nitrogen, hydro-fluorocarbon and oxygen based plasma and the nitrogen, fluorocarbon and oxygen based plasma improves upon a sidewall profile of the patterned features.

14. The method of claim 1, wherein the nitrogen portion of each of the nitrogen, hydro-fluorocarbon and oxygen based plasma and the nitrogen, fluorocarbon and oxygen based plasma improves upon a sidewall profile of the patterned features.

15. The method of claim 1, wherein transferring the pattern into the quartz substrate includes transferring the pattern to a substantially uniform depth across the quartz substrate.

16. The method of claim 1, wherein nitrogen of each of the nitrogen ($N_2$), hydro-fluorocarbon ($C_xH_yF_z$), and oxygen ($O_2$) based plasma and the nitrogen, fluorocarbon ($C_xF_z$), and oxygen based plasma promotes more vertical patterned feature sidewalls by inhibiting excessive polymerization on the sidewalls of the patterned features.

17. The method of claim 16, wherein a resultant vertical profile of the patterned feature sidewalls is on an order of less than five degrees (5°) from vertical.

18. The method of claim 1, wherein etching the Cr and $CrO_xN_y$ layers occurs at an etch rate sufficient to retain an integrity of the pattern being transferred to the quartz mask.

19. The method of claim 1 further comprising reducing faceting at corners of the Cr layer when etching the quartz substrate with one of a nitrogen ($N_2$), hydro-fluorocarbon ($C_xH_yF_z$), and oxygen ($O_2$) based plasma and a nitrogen ($N_2$), fluorocarbon ($C_xF_z$) and oxygen ($O_2$) based plasma.

20. A method for manufacturing a semiconductor mask comprising:

providing a quartz mask, the quartz mask comprising a quartz substrate, a Cr layer overlying the quartz substrate, and a $CrO_xN_y$ layer overlying the Cr layer, the Cr layer and $CrO_xN_y$ layer comprising a pattern for being transferred into the underlying quartz substrate, where x and y are integers; and etching the quartz substrate in a plasma containing a range of nitrogen ($N_2$) of substantially fifty percent or greater to transfer the pattern into the underlying quartz substrate, where the pattern forms openings in the quartz substrate having sidewall profiles on an order of substantially five degrees or less from a vertical reference.

* * * * *